(12) United States Patent
Waldhauer et al.

(10) Patent No.: US 7,704,327 B2
(45) Date of Patent: Apr. 27, 2010

(54) HIGH TEMPERATURE ANNEAL WITH IMPROVED SUBSTRATE SUPPORT

(75) Inventors: Ann P. Waldhauer, La Honda, CA (US); Juan M. Chacin, Palo Alto, CA (US); Brian H. Burrows, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 144 days.

(21) Appl. No.: 10/261,391

(22) Filed: Sep. 30, 2002

(65) Prior Publication Data

US 2004/0060512 A1    Apr. 1, 2004

(51) Int. Cl.
C23C 16/44 (2006.01)
C23F 1/00 (2006.01)
H01L 21/306 (2006.01)
F27B 5/14 (2006.01)
C23C 16/06 (2006.01)
C23C 16/22 (2006.01)

(52) U.S. Cl. .................. 118/724; 219/390; 156/345.37

(58) Field of Classification Search ................. 118/715, 118/728, 50, 724; 156/345.29, 345.33, 345.37; 219/390
See application file for complete search history.

(56) References Cited

U.S. PATENT DOCUMENTS

| | | | | |
|---|---|---|---|---|
| 3,785,862 A | * | 1/1974 | Grill ........................... | 438/674 |
| 4,660,501 A | * | 4/1987 | Nagata et al. ................ | 118/203 |
| 4,851,097 A | * | 7/1989 | Hattori et al. .......... | 204/192.33 |
| 4,978,412 A | * | 12/1990 | Aoki et al. .............. | 156/345.51 |
| 5,094,885 A | * | 3/1992 | Selbrede ................... | 427/248.1 |
| 5,169,453 A | * | 12/1992 | Takagi ...................... | 118/728 |
| 5,169,684 A | * | 12/1992 | Takagi ..................... | 427/248.1 |
| 5,226,732 A | * | 7/1993 | Nakos et al. ................. | 374/133 |
| 5,330,607 A | * | 7/1994 | Nowicki ................... | 156/345.1 |
| 5,383,971 A | * | 1/1995 | Selbrede ..................... | 118/728 |
| 5,433,786 A | * | 7/1995 | Hu et al. ................... | 118/723 E |
| 5,474,612 A | * | 12/1995 | Sato et al. .................... | 118/725 |
| 5,527,393 A | * | 6/1996 | Sato et al. .................... | 118/725 |
| 5,538,540 A | * | 7/1996 | Whitlock ...................... | 96/111 |
| 5,563,092 A | * | 10/1996 | Ohmi .......................... | 438/485 |

(Continued)

FOREIGN PATENT DOCUMENTS

JP          11016837 A   *   1/1999

OTHER PUBLICATIONS

Maszara, W.P., et al., "Quality of SOI film after surface smoothing with hydrogen annealing, touch-polishing," Proceedings 1997 IEEE International SOI Conference, Oct. 1997, pp. 130-131.

(Continued)

*Primary Examiner*—Rudy Zervigon
(74) *Attorney, Agent, or Firm*—Blakely Sokoloff Taylor & Zafman

(57) ABSTRACT

A method including removing an impurity from a gas stream to a processing chamber at a point of use. An apparatus with a point of use purifier on a gas stream. An apparatus including a shelf having dimensions suitable for placement within a thermal processing including a body of a material that renders the body opaque to radiation frequency range used for a temperature measurement of a substrate in a thermal processing chamber.

1 Claim, 5 Drawing Sheets

U.S. PATENT DOCUMENTS

| | | | |
|---|---|---|---|
| 5,593,727 A * | 1/1997 | Desu et al. | 427/248.1 |
| 5,599,381 A * | 2/1997 | Whitlock | 95/90 |
| 5,604,151 A * | 2/1997 | Goela et al. | 427/162 |
| 5,660,472 A * | 8/1997 | Peuse et al. | 374/128 |
| 5,755,511 A * | 5/1998 | Peuse et al. | 374/128 |
| 5,820,261 A | 10/1998 | Yam | |
| 5,848,842 A * | 12/1998 | Peuse et al. | 374/1 |
| 5,848,889 A * | 12/1998 | Tietz et al. | 432/258 |
| 5,851,293 A * | 12/1998 | Lane et al. | 118/715 |
| 5,884,412 A * | 3/1999 | Tietz et al. | 34/58 |
| 5,960,555 A * | 10/1999 | Deaton et al. | 34/58 |
| 6,022,812 A * | 2/2000 | Smith et al. | 438/761 |
| 6,035,100 A * | 3/2000 | Bierman et al. | 392/416 |
| 6,048,403 A * | 4/2000 | Deaton et al. | 118/725 |
| 6,157,106 A * | 12/2000 | Tietz et al. | 310/90.5 |
| 6,167,194 A * | 12/2000 | Moto et al. | 392/418 |
| 6,168,668 B1 * | 1/2001 | Yudovsky | 118/715 |
| 6,200,388 B1 * | 3/2001 | Jennings | 118/728 |
| 6,277,198 B1 * | 8/2001 | Yao et al. | 118/503 |
| 6,395,363 B1 * | 5/2002 | Ballance et al. | 428/64.1 |
| 6,402,846 B1 * | 6/2002 | Johnson | 118/679 |
| 6,423,949 B1 | 7/2002 | Chen et al. | |
| 6,454,865 B1 * | 9/2002 | Goodman et al. | 118/728 |
| 6,776,849 B2 * | 8/2004 | Aggarwal et al. | 118/728 |

OTHER PUBLICATIONS

Moriceau, H., et al., "Hydrogen annealing treatment used to obtain high quality SOI surfaces," Proceedings 1998 IEEE International SOI Conference, Oct. 1998, pp. 37-38.

Sato, N., et al., "Hydrogen annealed silicon-on-insulator," Appl. Phys. Lett. 65 (15), Oct. 1994, pp. 1924-1926.

Sato, N., et al., "Suppression of Si Etching during hydrogen annealing of silicon-on-insulator," Proceedings 1998 IEEE International SOI Conference, Oct. 1998, pp. 17-18.

* cited by examiner

HIGH TEMPERATURE ANNEAL WITH IMPROVED SUBSTRATE SUPPORT

BACKGROUND

In many semiconductor device manufacturing processes, the required high levels of device performance, yield, and process repeatability can be achieved if constituents (gases, reactants, etc.) of known quality (e.g., purity) are delivered to a processing environment. Device performance, yield, and process repeatability can also be achieved if the substrate (e.g., a semiconductor wafer) remains relatively free of defects during processing of the substrate.

Rapid thermal processing (RTP) is used for several different fabrication processes, including rapid thermal annealing (RTA), rapid thermal cleaning (RTC), rapid thermal chemical vapor deposition (RTCVD), rapid thermal oxidation (RTO), and rapid thermal nitridation (RTN). Many advances in substrate processing techniques are generally seeking higher temperature processing conditions. One high temperature process, where temperatures of 1200° C. or greater are desired is in the formation of semiconductor on insulator (SOI) substrates. SOI substrates are desired, in one regard, because such substrates offer an alternative to increased device speed and performance with a given feature size (i.e., without decreasing device feature size).

In one technique for forming an SOI substrate, two substrates are bonded together and cleaved ("bond and cleave" method). A first substrate is first subjected to oxide (e.g., $SiO_2$) growth on a surface. A second substrate is implanted with a species that creates a damaged layer below a monocrystalline layer of sufficient thickness for device fabrication. The monocrystalline layer of the second substrate is bonded to the oxide surface of the first substrate and the composite substrate (of the first and second substrates) is cleaved at the damaged layer. The remaining composite structure includes a monocrystalline layer over an oxide layer.

The surface of the monocrystalline layer formed according to the bond and cleave method is typically rough following cleaving. The composite substrate is generally thermally annealed at a high temperature in a hydrogen ($H_2$) atmosphere to smooth the surface. The high temperature anneal surface smoothing process consists, in one embodiment, of a soak at around 1200° C. or greater for around 30 seconds or more in a $H_2$ atmosphere. This process is representatively described in the following articles: Sato & Yonehara, Appl Phys Lett 65 (15) 1994, pp. 1924-1926; Maszara et al., 1997 IEEE International SOI Conference Proceedings, pp. 130-131; and Moriceau et al., 1998 IEEE International SOI Conference Proceedings, pp. 37-38.

One criteria associated with high temperature anneal processing such as described is maintaining the quality of constituents delivered to the processing environment. An objective of a surface smoothing anneal, for example, is maintaining a moisture-free environment for this anneal. See Sato et al., 1998 IEEE International SOI Conference Proceedings, pp. 17-18 (noting etch or pitting rate related to amount of oxygen in hydrogen atmosphere). One guideline is that the gases used for the anneal have an oxygen or moisture content of less than one part per million (ppm). A representative purity measurement of gases that is typically delivered to a tool from a tank source, however, has been found to be on the order of 10 ppm range.

There is also a trend in RTP processes to increase substrate size so as to increase the number of devices which can be fabricated simultaneously. If substrate thickness is constant, the mass of the substrate is generally proportional to the square of its radius or edge length.

In susceptor-based processing systems, the substrate is supported by being placed on a susceptor support. Thus, the amount of support is proportional to the surface area of the substrate. In susceptorless processing systems, the substrate is generally only supported around its perimeter with an edge ring. In one type of susceptorless system, the edge ring is positioned between a heat source, such as a number of lamp heaters, and a reflector plate to reflect radiation from the heat source to a substrate seated on the edge ring. A substrate is supported at its edge by the edge ring.

In susceptorless systems, the edge ring has a tendency to impart a localized ring of scratches around the perimeter of the bottom surface of the substrate, which may be explained as follows. A substrate tends to sag where it is not supported by the edge ring, i.e., in areas away from its edge, causing the substrate to assume a curved shape. Exposure of the substrate to high temperatures makes the substrate more susceptible to sag, thus increasing its curvature.

Because of its curvature, the edge of the substrate assumes a slight angle from the horizontal. For instance, the edge of a 12-inch (300 mm) diameter substrate may be about 150 μm higher than its center at room temperature, thereby causing the edge of the substrate to assume an angle of about 0.1 degrees from the horizontal. Due to this angle, the substrate does not rest flat on the surface of the edge ring but instead contacts the ring's inside edge. As a result, the edge ring tends to scratch the bottom surface of the substrate.

300 mm (12 inch) substrates are especially susceptible to scratches for two reasons. First, 300 mm substrates are heavier and more highly curved when supported at their edge, causing the substrate to contact the edge ring with greater force. Second, larger substrates are typically provided with backside surfaces that are highly polished, which tend to show scratches more readily than unpolished surfaces.

A ridge, or "edge crown", or nodules present on the inside edge of the edge ring were also found to scratch the substrate. The edge crown, which is formed when the edge ring is coated with a layer of polycrystalline silicon (polysilicon), is composed of excess polysilicon that preferentially deposits on the inside edge of the edge ring. The edge ring is typically coated with a layer of polysilicon to render it opaque in the frequency range used for temperature measurements of the substrate, thereby improving the accuracy of the temperature measurement. Nodules tend to form when the substrate and edge ring are of similar materials (e.g., silicon) and, as the melting point of the material is approached, the edge ring and substrate stick together and material is transferred to the edge ring. The material transferred from the substrate to the edge ring, typically classified in the form of a nodule, can damage successive substrates.

Scratches on the surface of a substrate are undesirable because they tend to increase the susceptibility of the substrate to slip. Slip is a defect in the crystalline structure of the substrate that tends to destroy any devices through which it may pass, thereby reducing the yield of the substrate. More particularly, the presence of scratches on a substrate causes slip to occur in the substrate at a lower temperature than if no scratches were present. In other words, the presence of scratches makes a substrate less robust and less able to tolerate high temperatures. Scratches also increase the susceptibility of a substrate to slip under rapidly varying temperature conditions. Scratches are therefore a particularly significant problem for substrates processed in RTP chambers, where temperatures typically exceed 1100° C. and are subject to rapid change.

In addition to increasing the susceptibility of a substrate to slip, scratches also introduce undesirable cosmetic imperfections in the substrate. Furthermore, scratches may generate stray particles that may contaminate a device fabrication process, thereby decreasing yield.

SUMMARY

A method is described suitable in one aspect for improving the quality of constituents (e.g., gases, reactants) to a thermal processing environment. In one embodiment, the method includes removing an impurity from a gas stream to a processing chamber at a point of use. In terms of a surface smoothing operation, for example, an SOI process, the method may be used to reduce the oxygen or moisture content of a source gas or gases to a quantifiable and acceptable level (e.g., 1 ppm or less).

In another embodiment, an apparatus (system) is described that is suitable for thermal processing operations to a substrate. The apparatus includes a thermal processing chamber and a gas source with a point-of-use purifier positioned between the chamber and the thermal processing chamber. In this manner, the quality of a gas may be improved prior to the gas entering the chamber.

In still another embodiment, an apparatus that is suitable as an edge-ring in a susceptorless system is described. The apparatus (e.g., edge ring) includes a shelf portion of a body of a material that renders the body opaque to radiation in a frequency range used for temperature measurement of a substrate in a thermal processing chamber. In this manner, it is unnecessary to coat the shelf portion or apparatus (e.g., edge ring) with an opaque coating such as polycrystalline silicon (polysilicon) that can flake off or form nodules, particularly under high temperatures or prolonged use, that can damage a substrate (wafer) during thermal processing.

In another embodiment, the opaque apparatus (e.g., edge ring) may have an angled shelf (e.g., angled face portion or angled radial width) that is greater than a projected sag angle of a substrate (e.g., 200 mm or 300 mm substrate) subjected to thermal processing, particularly but not limited to thermal processing of up to or greater than 1200° C.

In another embodiment, an apparatus suitable as an edge-ring in a susceptorless system for processing D-shaped or flatted substrates is described. The apparatus includes a shelf comprising a shape similar to a shape of a substrate to be placed on the shelf. In this manner, an edge ring having a minimum width to support a substrate may be utilized thus minimizing the contact between the shelf and a substrate supported by the shelf. The apparatus may include a body of a material that renders the body opaque to radiation in a frequency range used for temperature measurement of a substrate in a thermal processing chamber. Alternatively, the apparatus may include a body of a material that is not generally opaque under such conditions but may be rendered opaque with a suitable coating. The shelf of the apparatus may also have an angled surface (face portion).

BRIEF DESCRIPTION OF THE DRAWINGS

The invention is further described by way of example with reference to the accompanying drawings wherein.

DETAILED DESCRIPTION

Figure 1:
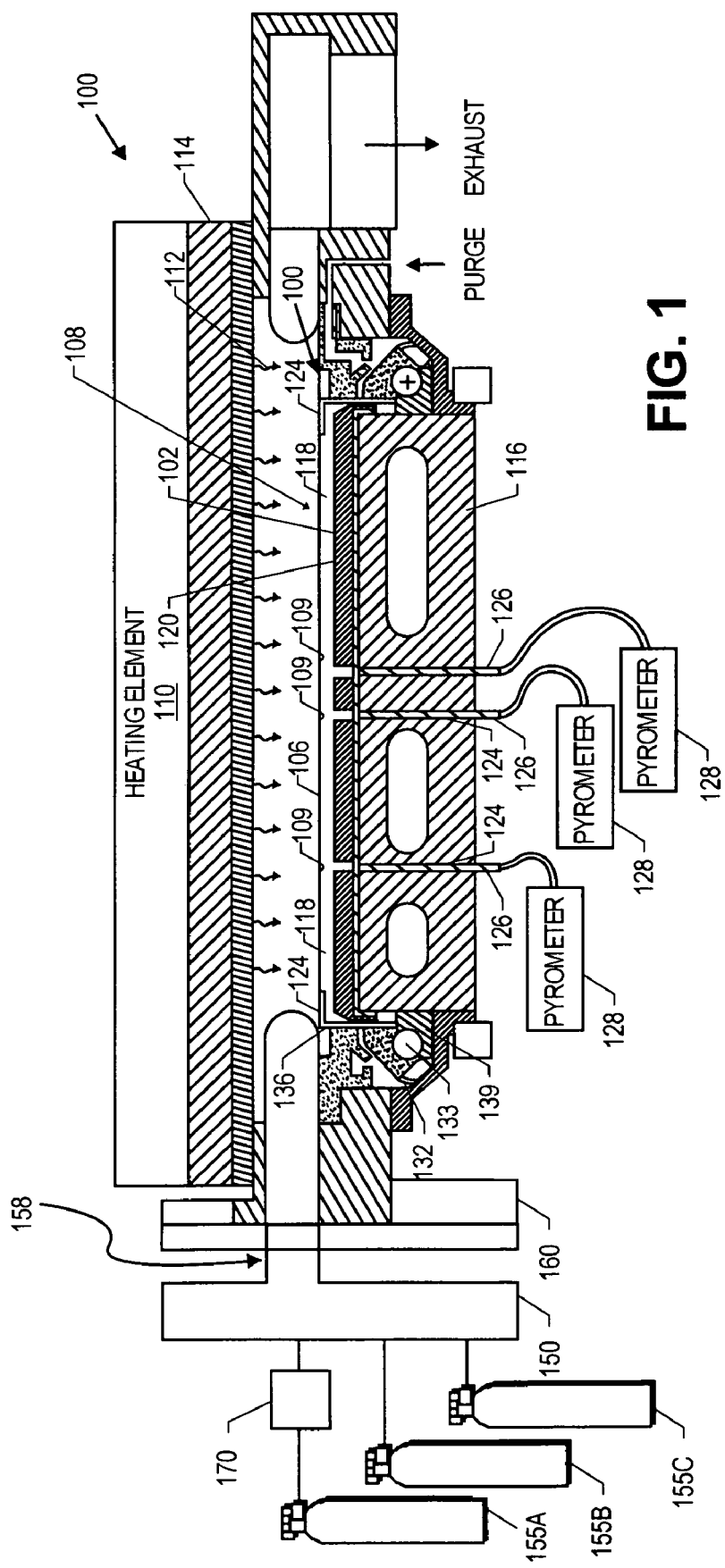
FIG. 1 is a cross-sectional side view of an RTP system.

A representative RTP system is shown in FIG. 1. Components of this system are described in further detail in co-pending U.S. Pat. No. 5,755,511, titled "Method and Apparatus for Measuring Substrate Temperatures," and U.S. Pat. No. 6,395,363, titled "Sloped Substrate Support," which are each incorporated herein by reference.

The RTP system shown in FIG. 1 includes processing chamber 100 for processing disk-shaped, 200 mm (8 inch) or 300 mm (12 inch) diameter substrate 106 such as a silicon wafer. Substrate 106 is mounted inside the chamber at substrate support structure location 108 and is heated by heating element 110 located directly above the substrate. Heating element 110 generates radiation 112 that enters processing chamber 100 through quartz window assembly 114 that is approximately one inch (2.5 cm) above the substrate. Beneath substrate 106 is reflector 102 that is mounted on water-cooled, stainless steel base 116. Reflector 102 may be made of aluminum and has highly reflective surface coating 120. The underside of substrate 106 and the top of reflector 102 form reflecting cavity 118 for enhancing the effective emissivity of the substrate, leading to more accurate temperature measurement than if there were no reflector.

Edge ring 134 rests on rotatable tubular quartz cylinder 136 that is coated with silicon to render it opaque in the frequency range of temperature sensors (described below). The silicon coating on quartz cylinder 136 acts as a baffle to block out radiation from external sources that might confound the temperature measurements. The bottom of quartz cylinder 136 is held by annular upper bearing race 132 which rests on a plurality of ball bearings 133 that are, in turn, held within stationary, annular, lower bearing race 139. Alternatively, quartz cylinder 136 may be supported by a magnetically-levitated support structure such as described in commonly-assigned U.S. Pat. No. 6,157,106, titled "Magnetically-Levitated Rotor System for an RTP Chamber," which is incorporated herein by reference.

The temperatures at localized regions 109 of substrate 106 are measured by a plurality of temperature probes 126 and pyrometers 128. The temperature probes are distributed at varying distances from the center of substrate 106. During thermal processing in chamber 100, support structure location 108 may be rotated. One rotation rate for the bearing supported quartz cylinder described above is on the order of 90 revolutions per minute (rpm). One suitable rotation rate for magnetically-levitated support structures is 240 rpms. Thus, each probe actually samples the temperature profile of a corresponding annular ring area on the substrate. The support structure which rotates the substrate includes edge ring 134 which contacts the substrate around the outer perimeter of the substrate, thereby leaving all of the underside of the substrate exposed except for a small annular region about the outer perimeter.

Referring to FIG. 1, in one embodiment, system 100 includes gas manifold 150 to which one or more gas sources (gas source 155A, 155B, and 155C illustrated) are connected such as by hard or soft piping. Gas source 155A is, for example, a hydrogen ($H_2$) gas source that is delivered to manifold 150 prior to entry into the chamber. In connection with an SOI surface smoothing operation, for example, hydrogen gas may be delivered solely to the chamber or together with a carrier gas or other active gas. Manifold 150 is connected to gas entry port 158 of the chamber. One or more of the gas sources connected to manifold 150 may include some form of purification at the source (e.g., directly external to the tank). It has been found, however, that even with a purification system at the source, impurities such as oxygen (e.g., up to 10 ppm $O_2$ or more) can be detected at manifold 150. It should be appreciated that for safety or other reasons, gas sources such as tanks are generally located several feet, perhaps several hundred feet from a chamber. It is believed that even if a gas is purified at its source, impurities such as oxygen and moisture can be introduced before the gas enters a processing chamber. Therefore, system 100 includes point-of-use purification systems. In the embodiment shown in FIG. 1, point-of-use purifier 170 is located proximal to manifold 150 (e.g., between manifold 150 and gas source 155A). It is appreciated that individual purifiers may be present on each gas line (e.g., argon, nitrogen, inert, hydride, etc.). In one embodiment, purifier 170 is as close to entry port 158 as possible.

Suitable point-of-use purifiers are those that can be installed remotely from a gas source and, in one embodiment, trap oxygen ($O_2$) flowing through a gas line, preferably reducing the presence of oxygen to levels of 1 ppm or less in the gas stream. In another embodiment, to obtain acceptable purity levels of a gas entering a processing chamber, it may be necessary to install a number (two or more) of purifiers in series at a point-of-use. One example of a suitable point-of-use purifier for purifying a hydrogen gas stream to oxygen levels of 1 ppm or less in GATEKEEPER™, manufactured by Aeronex, Inc. of San Diego, Calif. Another suitable purifier is a NANOCHEM™ MEGASHIELD™ gas purifier available from Pall Corporation of East Hills, N.Y.

Although the above embodiment is described with reference to a $H_2$ anneal for surface smoothing of a composite SOI structure, the apparatus (system) described with point-of-use purifiers, a similar apparatus (system) may be employed in other processing environments where gas quality (e.g., purification) is desired. In terms of oxygen removal in hydrogen anneals, other processing environments include, but are not limited to, furnace anneals and implant anneals.

Figure 2:
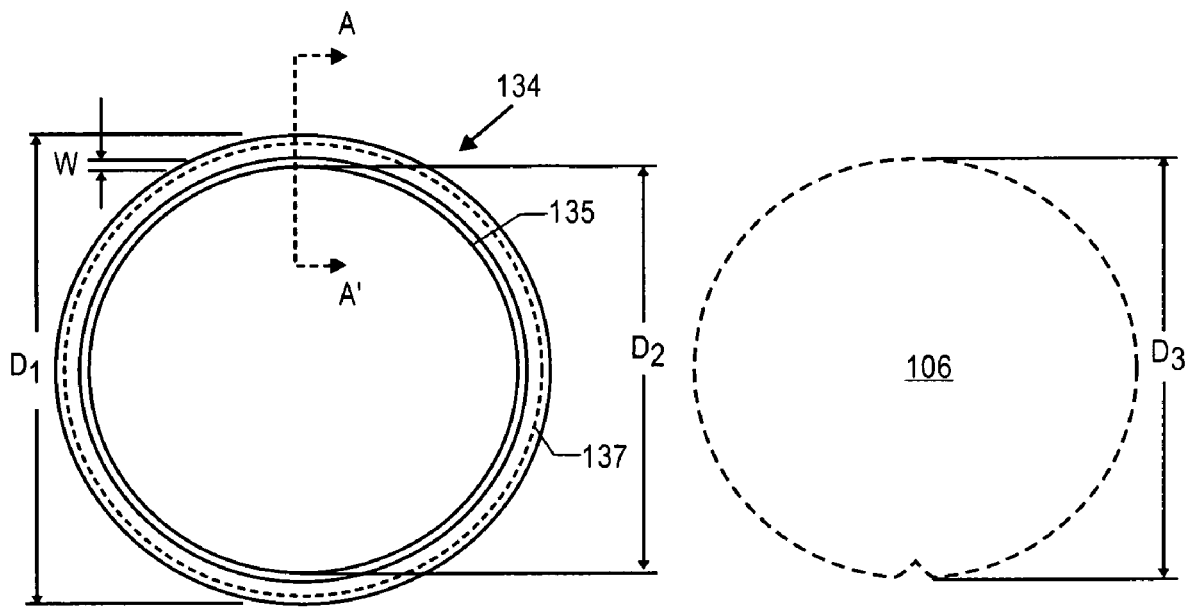
FIG. 2 is a plan view of an edge ring.
Figure 3:
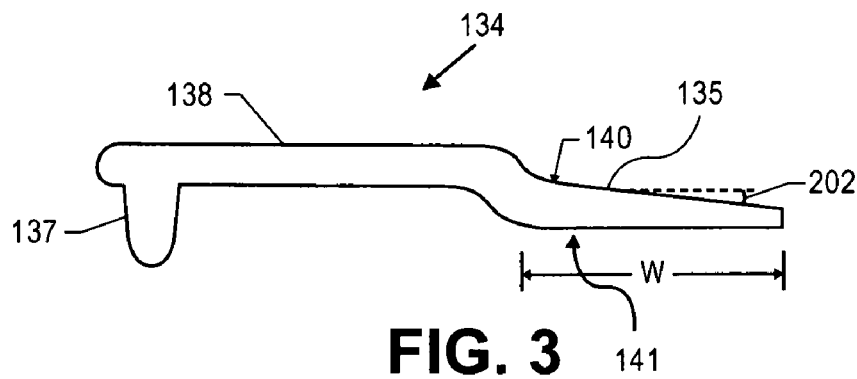
FIG. 3 is a cross-sectional side view of the edge ring of FIG. 2 along line A-A'.

Referring to FIGS. 2 and 3, edge ring 134 of system 100 includes mount portion 138 and annular shelf 135 upon which the edge of substrate 106 rests. Edge ring 134 may also include annular rib 137. Rib 137 provides structural support for edge ring 134. Face portion 140 of annular shelf 135 is sloped at angle 202 from the horizontal (as viewed) opposite base portion 141.

For a 12 inch (300 mm) substrate, edge ring 134 may have an outer diameter ($D_1$) of approximately 13.2 inches (335 mm). Annular shelf 135 may have a radial width (W) of approximately 0.18 inches (4.5 mm). An inner diameter ($D_2$) of edge ring 134 (defined by shelf 135) is slightly less than a diameter ($D_3$) of a substrate (e.g., substrate 106) projected to be placed on shelf 135. Representatively, one suitable inner diameter ($D_2$) of edge ring 134 for a 12 inch (300 mm) substrate is 11.7 inches (297 mm). In this manner, the radial overlap between substrate 106 and edge ring 134 may be approximately 2 to 3 mm (e.g., 2.7 to 3 mm) if substrate 106 is placed in a centered position on annular shelf 135. This generally describes a "narrow shelf" that is suitable for substrates that have a reference notch cut-out (e.g., "notched wafers") of less than 2.7 mm. Another type of substrate is generally cylindrical but includes a flat section as a reference ("flatted" or "D-shaped" wafer). In order to capture the entire substrate wafer on the edge ring, the annular shelf of a suitable edge ring (the radial width) is generally longer, e.g., on the order of 7 mm.

Figure 4:
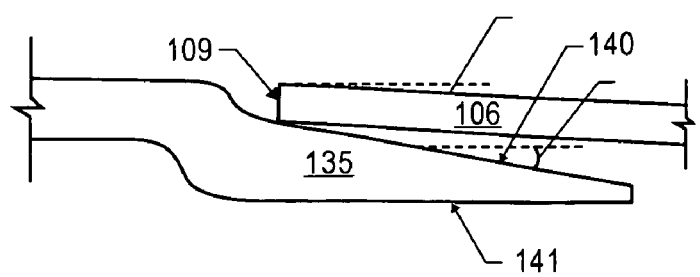
FIG. 4 is an enlarged cross-section side view of the edge ring of FIG. 3 and illustrates a substrate seated on the edge ring.

Referring to FIG. 4, angle α of annular shelf 135 is selected such that face portion 140 of edge ring 134 contacts substrate 106 substantially at an edge portion 109 of the substrate. Angle α may be greater than or equal to projected angle β of edge portion 109 of substrate 106 from horizontal (as viewed) using base portion 141 as a horizontal reference plane. Because the curvature of substrate 106 tends to increase at higher temperatures, angle α may be selected to be greater than or equal to angle β at the highest temperature to which substrate 106 is exposed. Angle α may, for instance, range from 1 to 10 degrees from the horizontal. In one embodiment, angle α ranges from 1.66 to 2.80 degrees from horizontal (as viewed) with base portion 141 of edge ring 134 as a reference.

Face portion 140 of annular shelf 135 may assume one of a variety of shapes. As shown in FIGS. 3 and 4, face portion 140 may have a cross-section that is substantially planar. Alternatively, face portion 140 may have a cross-section that is concave or convex (not shown). Furthermore, the cross-sectional shape of face portion 140 may be spherical, parabolic, hyperbolic, or some other empirically derived shape. If face portion 140 is concave or convex, angle α varies radially across the shelf. For example, angle α may be 1 degree at an inner edge of annular shelf 135, 3 degrees at a middle region and 5 degrees at an outer edge.

Figure 5:
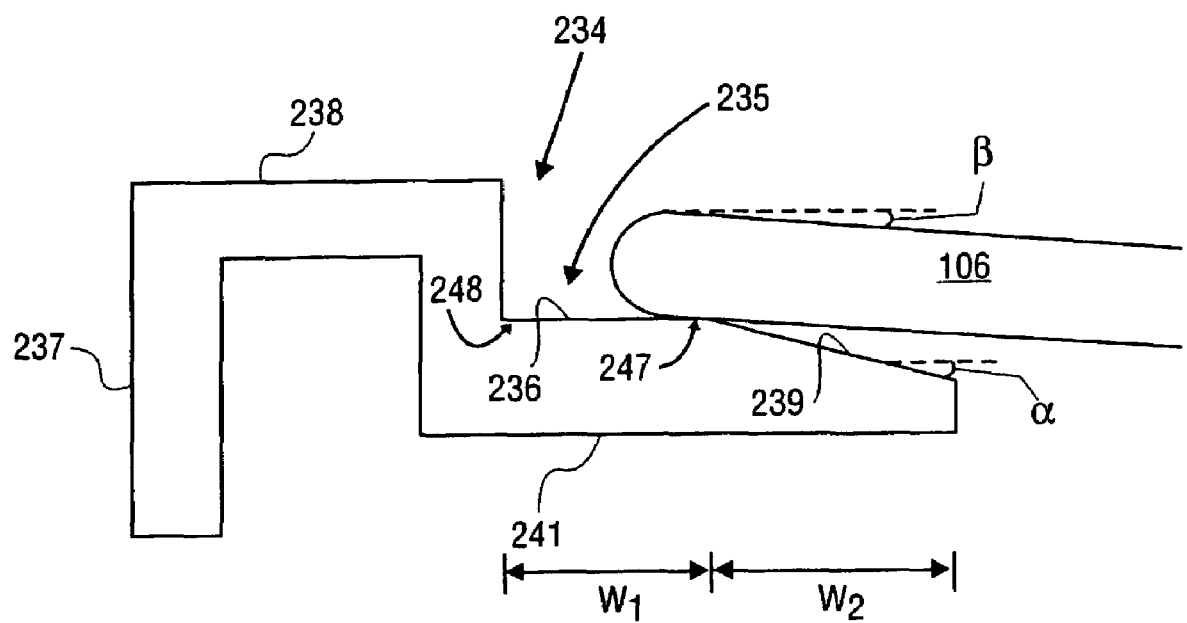
FIG. 5 is a cross-sectional side view of another embodiment of an edge ring suitable for a flatted or D-shaped substrate.

FIG. 5 illustrates another embodiment of an edge ring. Edge ring 234 includes annular mount portion 238, annular shelf 235, and annular rib 237. For a 12 inch (300 mm) substrate, edge ring 234 may have a diameter of approximately 13.2 inches (335 mm). Annular shelf 235 may have a radial width of 0.18 inches (4.5 mm). In this embodiment, annular shelf 235 includes as a face portion both support portion 236 and angled portion 239. Support portion 236 is generally horizontal (as viewed with base portion 241 as a horizontal reference) and has a radial width ($W_1$) on the order of 2.5 mm. Angled portion 239 of the face portion has a radial width ($W_2$) on the order of 2 mm and a surface that is angled from horizontal (as viewed) at an angle α greater than or equal to projected angle β of substrate 106 at the temperature to which substrate 106 is projected to be exposed (e.g., temperatures up to or greater than 1200° C.). Angle α may, for instance, range from 1 to 10 degrees from horizontal (as viewed). In one embodiment, angle α ranges from 1.66 to 2.80 degrees. It is appreciated that due to the angled surface of angled portion 239, a length of the face portion (support portion 236 plus angled portion 239) is greater than a length of base portion 241.

In the embodiment shown in FIG. 5, in one projected configuration, substrate 106 contacts the face portion of edge ring 234 at support portion 236, avoiding any contact between sensitive regions of substrate 106 and edge ring 234. Thus, an inner diameter (measured from reference numeral 247) of support portion 236 of an annular edge ring (edge ring 234) is slightly less than a diameter of a substrate projected to be placed on edge ring 234 (e.g., on the order of 0.5 mm to 1 mm less). An outer diameter (measured from reference numeral 248) of support portion 234 may be larger than a diameter of a substrate projected to be placed on edge ring 234 so that the substrate may be accommodated on support portion 236.

In one embodiment, the body of edge ring 134 (FIG. 2 and FIG. 3) or 234 (FIG. 5) is made of a material that renders the body opaque to radiation in a frequency range used for a temperature measurement of a substrate (e.g., wafer) in a thermal processing chamber. In this manner, the body of edge ring 134 or 234 is opaque and an additional coating with, for example, polysilicon is unnecessary. At higher temperatures, such as on the order of 1200° C. or greater, silicon (polysilicon) coatings can flake off and bond to a substrate on the edge ring. Such flaking is avoided when the edge ring body, as opposed to a coating on the body, is opaque. Alternatively, a coating can develop edge crowns or nodules that can scratch a substrate or lead to slip. Suitable materials for edge ring 134 or 234 that render the body of edge ring 136 opaque to radiation in a frequency range used for a temperature measurement of a substrate in a thermal processing chamber include low resistivity silicon carbides, such as certain silicon carbide alloys, sintered silicon carbide, and doped silicon carbide alloys. Suppliers of suitable opaque materials include Rohm and Haas Company of Philadelphia, Pa.; Morgan Advanced Semiconductor Materials of Hayward, Calif.; Coors Tek of Golden, Colo.; and Toshiba Ceramics Co., Ltd. of Tokyo, Japan.

Referring to FIG. 3 and FIG. 5, face portion 200 of annular shelf 135 (FIG. 3) or the face portion of support portion 236 and angled portion 239 of annular shelf 235 (FIG. 5) may be machined or polished to increase its smoothness, thereby reducing its tendency to scratch a substrate. If machined, the face portion may have a surface roughness on the order of about 4-16 microinches. If polished, the face portion may have a surface roughness of about 0.4 to 4 microinches. For comparison purposes, an unfinished face portion of a silicon carbide alloy has a surface roughness of about 40 to 100 microinches. The face portion may also be provided with an optical quality polish. Polished in this manner, the face portion may have a surface roughness of about 0.02 to 0.2 microinches (5 to 50 angstroms). The polish may be performed either by hand or by machine.

Figure 6:
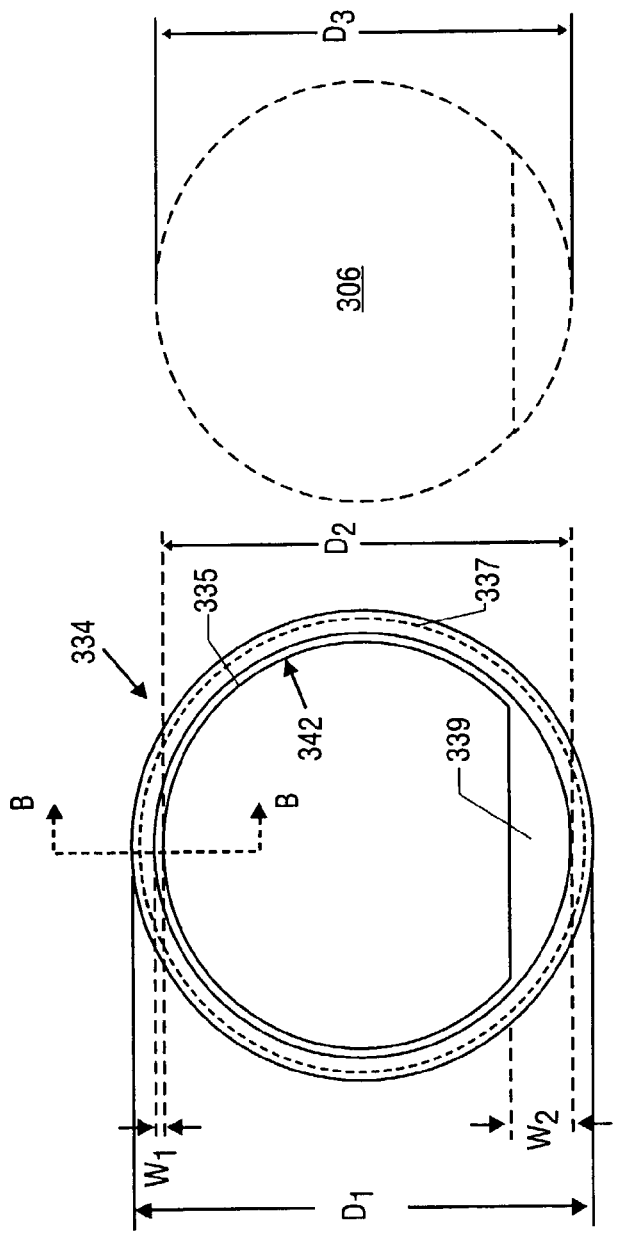
FIG. 6 is a plan view of another embodiment of an edge ring.
Figure 7:
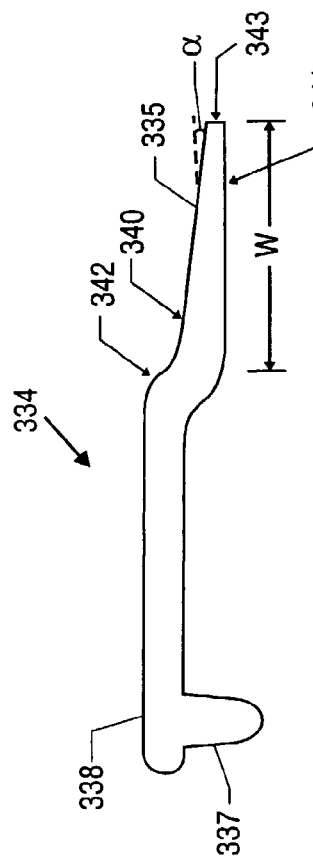
FIG. 7 is a cross-sectional side view of the edge ring of FIG. 6 along line B-B'.

In an embodiment where an edge ring will support a flatted or D-shaped substrate (generally 8 inch (200 mm) substrates), the edge ring may have a shape corresponding to the shape of the substrate. In this manner, the shelf of the edge ring may have a smaller length and the corresponding radial overlap of a substrate on the edge ring may be reduced to, for example, on the order of 3 mm or less. FIG. 6 and FIG. 7 illustrate this embodiment. FIG. 6 shows a top plan view of edge ring 334. Edge ring 334 includes mount portion 338 that is generally annular and shelf portion 335 that is generally annular with flatted portion 339. In an alternative embodiment, flatted portion 339 may be a part of mount portion 338.

Flatted portion 339 of shelf portion 335 has a length or radial width ($W_2$), in one embodiment, longer than a length or radial width ($W_1$) of the remainder of shelf portion 335. In one embodiment, the length of shelf portion 335 ($W_1$) is less than 5 mm (e.g., 4.5 mm) except flatted portion 339 that has a length or radial width ($W_2$) at its largest point of 9 mm or greater. An inner diameter of ($D_2$) of edge ring 334 (defined by shelf 335) is slightly less than a diameter ($D_3$) of substrate (e.g., substrate 306) projected to be placed on shelf 335. Representatively, one suitable inner diameter ($D_2$) of edge ring 334 for an 8 inch (200 mm) substrate is 7.8 inches (197 mm). In this manner, the radial overlap between substrate 306 and edge ring 334 may be approximately 3 mm or less if substrate is placed in a centered position on annular shelf 335.

A length (radial width) of flatted portion 339 is selected, in one embodiment, so a similar 3 mm or less overlap may be achieved in this region of edge ring 334.

Figure 8:
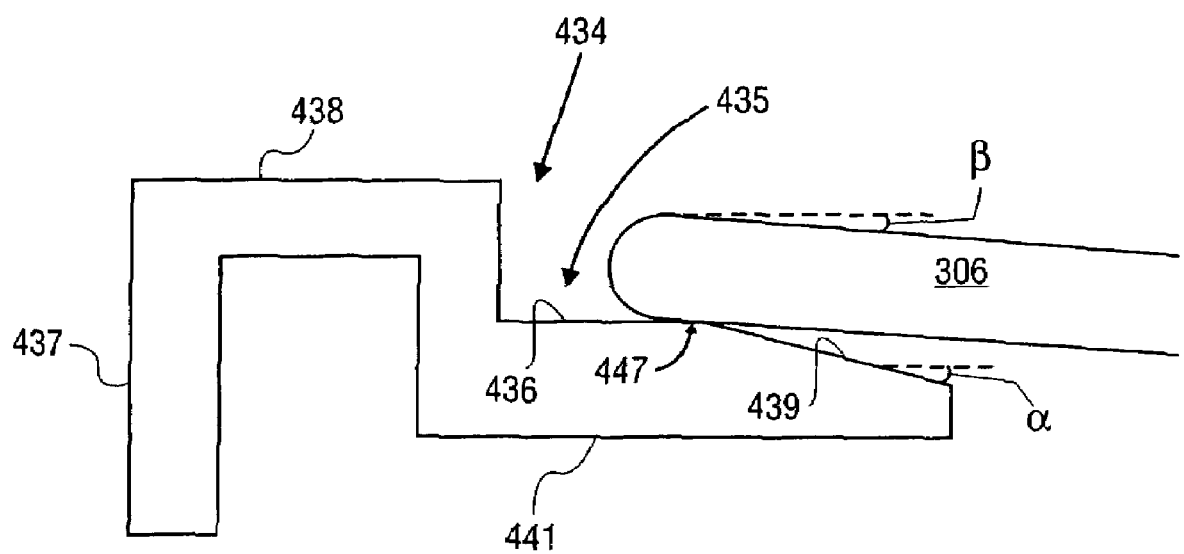
FIG. 8 is a cross-sectional side view of another embodiment of an edge ring suitable for a flatted or D-shaped substrate.

FIG. 7 shows a cross-sectional side view of edge ring 334 through line B-B' of FIG. 6. For a 200 mm (8 inch) substrate, edge ring 334 may have a diameter ($D_1$) of approximately 9.3 inches (236 mm). FIG. 7 shows shelf portion 335 having an angled surface (face portion 340) relative to generally horizontal base portion 341 of shelf portion 335 as viewed. It is appreciated that, depending on the thickness of shelf portion 335, angled face portion 340 will be longer than base portion 341. In one embodiment, an angle 342 of face portion 340 from horizontal as viewed with base portion 341 as a reference is selected to be greater than a projected sag angle of a substrate on shelf 335 of edge ring 334 at high temperatures, for example, temperatures up to or greater than 1200° C. A suitable angle α of face portion 340 is on the order of one to 10 degrees, for example, 3.5 degrees or less (e.g., 1.66 to 2.80 degrees). Although face portion 340 of shelf portion 335 is illustrated as an angled surface, shelf portion 335 may alternatively be configured as in FIG. 5. FIG. 8 illustrates such an embodiment.

FIG. 8 shows edge ring 434 having shelf portion 435. Edge ring 434 is similar in a plan view to the embodiment shown in FIG. 6 (including flatted portion 339). Shelf portion 435 includes generally horizontal support portion 436 having a radial width on the order of 2.5 mm over the entire region, including a flatted portion (see, e.g., flatted portion 339 in FIG. 6). Shelf portion 335 also includes angled portion 439 having a radial width on the order of 2 mm over the entire region including flatted portion 439. Angled portion 339 is angled from horizontal at an angle α (as viewed with base portion 341 as a horizontal reference) greater than or equal to projected angle β (sag angle relative to horizontal base portion) of substrate 306 at the temperature to which substrate 306 is projected to be exposed (e.g., temperatures up to or greater than 1200° C.). Angle α may range from 1 to 10 degrees (e.g., 1.66 to 2.80 degrees). In the embodiment shown in FIG. 8, in one projected configuration, substrate 306 contacts the face portion of edge ring 434 at support portion 436. One inner diameter (measured from reference numeral 447) of support portion 436 is on the order of 0.5 mm to 1 mm less than a diameter of a substrate projected to be placed on edge ring 444 (e.g., substrate 306).

For an embodiment where an edge ring has a flatted or D-shaped configuration, in one embodiment, the body of the edge ring (e.g., the body of edge ring 334) may be made of a material that renders the body opaque to radiation in a frequency range used for a temperature measurement of a substrate (e.g., wafer) in a thermal processing chamber. In this manner, the body of the edge ring is opaque and an additional coating with, for example, polysilicon is unnecessary. Suitable materials noted above for an opaque edge ring body include, but are not limited to, silicon carbide alloys.

Edge ring 334 may alternatively be made of a material, such as silicon carbide that is transparent to radiation in the frequency range used for temperature measurements of the substrate. As a result, edge ring 334 may transmit stray radiation that may affect the accuracy of the temperature measurement. Therefore, edge ring 334 may be coated with a layer of polycrystalline silicon (polysilicon) to render it opaque to such radiation. A polysilicon layer may be formed by a deposition process using two masks, one for each surface. The thickness of a polysilicon layer may be about 100 μm.

The deposition of polysilicon layer on edge ring 334, however, may result in the formation of a ridge. A ridge can form during the deposition of a polysilicon layer as a result of the preferential deposition of polysilicon at inner edge 343 of edge ring 334. As noted earlier, a ridge may scratch a substrate on edge ring 334.

To prevent the scratching from occurring, a polysilicon layer may be disposed solely on bottom surface 341 of edge ring 334. A polysilicon layer may be deposited using a single mask. This embodiment provides a substrate with a contact surface to edge ring 334 composed of, for example, SiC rather than polysilicon.

Alternatively, a polysilicon layer may be formed on both face portion 340 and base portion 341, but with the polysilicon layer removed from face portion 340 of annular shelf 335. A polysilicon layer may be removed with a single mask using, for example, a dry hydrogen chloride (HCl) etch. This embodiment inhibits a ridge from scratching a substrate on edge ring 334. It also provides a substrate with a contact surface to edge ring 334 composed of, for example, SiC rather than polysilicon.

If edge ring 334 is coated with a polysilicon layer, the edge ring may further include a layer of silicon nitride ($Si_3N_4$) disposed on the polysilicon layer. The silicon nitride layer acts as a diffusion barrier to inhibit metal impurities that may be present in the polysilicon layer from contaminating a substrate on edge ring 334.

One advantage of an edge ring that is of a material that renders the body opaque to radiation in a frequency range used for a temperature measurement of a substrate in a thermal processing chamber, particularly but not limited to, at high temperatures in that nodules that can form when using a coating, such as a polysilicon coating, are avoided. Nodule formation is particularly noted at prolonged use of coated edge rings at high temperature. Such nodules can cause undesirable slip in portions of the substrate. Another challenge of high temperature processing is to maintain a relatively moisture-free environment to avoid etching (and roughening) of a substrate surface.

In the preceding detailed description, the invention is described with specific embodiments have been described. It will, however, be evident that various modifications and changes may be made thereto without departing from the broader spirit and scope of the disclosure as set forth in the claims. The specification and drawings are, accordingly, to be regarded in an illustrative rather than a restrictive sense.

What is claimed is:

1. An apparatus comprising:
    a thermal processing chamber having dimensions suitable for accommodating a substrate;
    at least one source gas coupled to the chamber; and
    a purifier coupled to the at least one source gas at a location adjacent to an inlet to the chamber, wherein the purifier is capable of removing at least one of oxygen and water from a stream of the source gas at a process flow rate, wherein the at least one source gas comprises hydrogen.

* * * * *